United States Patent
Suzuki et al.

(10) Patent No.: US 7,997,760 B2
(45) Date of Patent: Aug. 16, 2011

(54) ENAMEL SUBSTRATE FOR MOUNTING LIGHT EMITTING ELEMENTS, LIGHT EMITTING ELEMENT MODULE, ILLUMINATION APPARATUS, DISPLAY APPARATUS, AND TRAFFIC SIGNAL

(75) Inventors: Ryuji Suzuki, Sakura (JP); Kyosuke Takemoto, Sakura (JP)

(73) Assignee: Fujikura Ltd., Tokyo (JP)

( * ) Notice: Subject to any disclaimer, the term of this patent is extended or adjusted under 35 U.S.C. 154(b) by 585 days.

(21) Appl. No.: 11/916,734

(22) PCT Filed: Jun. 2, 2006

(86) PCT No.: PCT/JP2006/311096
§ 371 (c)(1),
(2), (4) Date: Dec. 6, 2007

(87) PCT Pub. No.: WO2006/132148
PCT Pub. Date: Dec. 14, 2006

(65) Prior Publication Data
US 2009/0225544 A1 Sep. 10, 2009

(30) Foreign Application Priority Data
Jun. 7, 2005 (JP) .................................. 2005-167498

(51) Int. Cl.
*F21S 4/00* (2006.01)
(52) U.S. Cl. .............. 362/249.01; 362/218; 362/217.07; 362/249.02; 362/555; 362/580; 257/98; 257/99; 257/100
(58) Field of Classification Search ............ 257/98–100; 362/217.07, 218, 249.01, 555, 580, 249.02; 428/131, 137, 472
See application file for complete search history.

(56) References Cited

U.S. PATENT DOCUMENTS

| | | | |
|---|---|---|---|
| 4,256,796 A | 3/1981 | Hang et al. | |
| 4,935,665 A | 6/1990 | Murata | |
| 5,150,016 A | 9/1992 | Sawase et al. | |
| 5,564,819 A | 10/1996 | Yamaguchi | |
| 6,517,218 B2 * | 2/2003 | Hochstein | 362/294 |
| 6,617,520 B1 | 9/2003 | Martter et al. | |
| 6,884,646 B1 | 4/2005 | Wu et al. | |
| 7,241,030 B2 * | 7/2007 | Mok et al. | 362/294 |
| 7,699,500 B2 * | 4/2010 | Takemoto et al. | 362/294 |
| 2001/0030866 A1 | 10/2001 | Hochstein | |
| 2003/0189829 A1 * | 10/2003 | Shimizu et al. | 362/240 |

(Continued)

FOREIGN PATENT DOCUMENTS

JP 59-009982 1/1984

(Continued)

OTHER PUBLICATIONS

Taiwanese Intellectual Property Office Ministry of Economic Affairs, "Notice of Allowance," issued in connection with Taiwanese Patent Application No. 95120581, dated Apr. 30, 2008.

(Continued)

*Primary Examiner* — Ali Alavi
*Assistant Examiner* — Mary Zettl
(74) *Attorney, Agent, or Firm* — Sughrue Mion, PLLC

(57) ABSTRACT

An enamel substrate for mounting light emitting elements includes a core metal, an enamel layer that is covering on a surface of the core metal, and one or more through holes. In this enamel substrate for mounting light emitting elements, the core metal is exposed at inner surfaces of the through holes.

10 Claims, 2 Drawing Sheets

U.S. PATENT DOCUMENTS

| | | |
|---|---|---|
| 2003/0189830 A1 | 10/2003 | Sugimoto et al. |
| 2003/0193055 A1 | 10/2003 | Martter et al. |
| 2003/0219919 A1 | 11/2003 | Wang et al. |
| 2005/0180142 A1* | 8/2005 | Tsai .............................. 362/294 |
| 2005/0199899 A1* | 9/2005 | Lin et al. ......................... 257/99 |
| 2008/0258169 A1 | 10/2008 | Masuko |

FOREIGN PATENT DOCUMENTS

| | | |
|---|---|---|
| JP | 62-84942 U | 5/1987 |
| JP | 64-28886 A | 1/1989 |
| JP | 3-209781 A | 9/1991 |
| JP | 3-258158 A | 11/1991 |
| JP | 4088694 A | 3/1992 |
| JP | 5-299701 A | 11/1993 |
| JP | 06-320790 A | 11/1994 |
| JP | 10-098215 A | 4/1998 |
| JP | 2890809 B2 | 5/1999 |
| JP | 2002-9349 A | 1/2002 |
| JP | 2002-232009 A | 8/2002 |
| JP | 2004-55160 A | 2/2004 |
| JP | 2004-55229 A | 2/2004 |
| JP | 2004-079750 A | 3/2004 |
| JP | 2004-146411 A | 5/2004 |
| KR | 10-2003-0085489 A | 11/2003 |
| TW | 553479 | 9/2003 |
| TW | I224876 | 12/2004 |
| TW | I232565 B | 5/2005 |

OTHER PUBLICATIONS

United States Patent and Trademark Office, "Non-Final Office Action," issued in connection with U.S. Appl. No. 11/953,522, dated Jun. 25, 2010.

United States Patent and Trademark Office, "Notice of Allowance," issued in connection with U.S. Appl. No. 11/953,522, dated Jan. 26, 2011.

State Intellectual Property Office of People's Republic of China, "Notification of the First Office Action," issued in connection with Chinese Patent Application No. 200680020310.3, dated Oct. 31, 2008.

Korean Intellectual Property Office, "Notice of Allowance of Patent," issued in connection with Korean Patent Application No. 10-2007-7029208, dated Nov. 26, 2010.

* cited by examiner

ENAMEL SUBSTRATE FOR MOUNTING LIGHT EMITTING ELEMENTS, LIGHT EMITTING ELEMENT MODULE, ILLUMINATION APPARATUS, DISPLAY APPARATUS, AND TRAFFIC SIGNAL

TECHNICAL FIELD

The present invention relates to a substrate for mounting light emitting elements that is used for mounting a plurality of individual light emitting elements, such as light emitting diodes (referred to below as LED), and particularly to an enamel substrate for mounting light emitting elements that is able to ensure a satisfactory heat dissipation performance even when light emitting elements are mounted at a high density in applications, such as illumination apparatuses, and to a light emitting element module that is formed by mounting light emitting elements on this substrate, and to an illumination apparatus that has this light emitting element module, and to a display apparatus and a traffic signal.

Priority is claimed on Japanese Patent Application No. 2005-167498, filed Jun. 7, 2005, the contents of which are incorporated herein by reference.

BACKGROUND ART

In recent years, LEDs have begun to be used as light sources for illumination. Conventional LED modules have a structure in which an electrode pattern is formed on a non-conductive circuit board that is made from glass epoxy resin or the like, and a reflective cup portion is provided that is used to efficiently reflect light emitted from an LED in a forward direction. An LED element is mounted on the bottom surface of this reflective cup portion, and the reflective cup portion is then sealed with resin using a transparent resin having a high refractive index.

When an LED is turned on, power which does not contribute to light emission is converted into heat. In order to use an LED for illumination, it is necessary to package a number of LED on a substrate, and supply a considerable amount of power thereto. Because of this, a mounting substrate which exhibits an excellent heat dissipation performance is required. However, when a circuit board that is formed from glass epoxy resin, which is typically used conventionally, is used as a substrate for mounting LED for illumination, because the heat dissipation performance of this substrate is poor, the temperature of the LED is increased by the generated heat and the problem arises that there is a deterioration in the light emitting efficiency of the LED.

Conventionally, the structure described in Patent Document 1 has been proposed as a circuit board structure having a good heat dissipation performance. This is a structure in which, in order to improve the heat dissipation performance of the substrate, a heat dissipation metal plate is connected to an exposed surface of the substrate core material. However, the technology described in Patent document 1 is intended to provide protection from the effects of heat when circuit components such as IC are mounted at a high density, and there is no description of its use as an illumination apparatus or of any usage of LED.

Patent document 1: Unexamined Japanese Patent Application, First Publication No. S64-28886

DISCLOSURE OF INVENTION

Problems to be Solved by the Invention

As is described above, when a large number of LED are mounted on a substrate, a considerable amount of heat is generated from the LED, and it is necessary to improve the heat dissipation performance of the substrate. Enamel substrates are an example of a substrate having an excellent heat dissipation performance. By using an enamel substrate which has an excellent heat dissipation performance as an illumination LED substrate, it is possible for a large number of LED to be mounted.

However, when an illumination LED module having a high level of brightness is being manufactured, it is necessary to package an even greater number of LED in a densely packed state on a substrate, or to use high-brightness LED elements, and, in order to achieve this, it is necessary to further improve the heat dissipation performance of the substrate.

Moreover, in the case of an illumination light source, it is necessary to reduce any unevenness in the brightness. In order to reduce brightness unevenness, it is necessary to regulate the current of the LED so as to cause light to be emitted uniformly. Current regulation may be achieved by mounting a resistor on an electric circuit or the like, however, in this case, because a heat generator is being mounted on the substrate, it is necessary to improve even further the heat dissipation performance of the LED mounting substrate.

The present invention was conceived in view of the above described circumstances and is an object thereof to provide an enamel substrate for mounting light emitting elements that provides an excellent heat dissipation performance, and to a light emitting element module that is formed by mounting light emitting elements on this substrate, and to an illumination apparatus that has this light emitting element module, and to a display apparatus and a traffic signal.

Means for Solving the Problem

In order to achieve the above described object, the present invention provides an enamel substrate for mounting light emitting elements that includes: a core metal; an enamel layer covering the surface of the core metal; and one or more through holes, wherein the core metal is exposed at inner surfaces of the through holes.

In the enamel substrate for mounting light emitting elements of the present invention, preferably, a heat dissipation structure that has protruding portions may be provided, and the protruding portions may be inserted into the heat dissipation through holes.

In the enamel substrate for mounting light emitting elements of the present invention, preferably, an adhesive agent having a high level of thermal conductivity may be provided in a connecting portion between the enamel substrate for mounting light emitting elements and the heat dissipation structure.

Moreover, the present invention provides a light emitting element module including light emitting elements mounted on the enamel substrate for mounting light emitting elements according to the present invention.

Moreover, the present invention provides an illumination apparatus, a display apparatus, and a traffic signal including the light emitting element module according to the present invention.

Advantageous Effects Of The Invention

As a result of the enamel substrate for mounting light emitting elements of the present invention being formed with a structure in which one or more heat dissipation through holes are provided in an enamel substrate, so that the core metal is exposed at inner surfaces of the heat dissipation through holes, heat that is generated when the light emitting elements are turned on is transmitted to the core metal and is rapidly conducted throughout the entire core metal. In addition, as a result of heat being transmitted from the exposed surfaces of the core metal at the inner surfaces of the heat dissipation through holes to the outside or to the heat dissipation structure, there is an improvement in the heat dissipation performance of the substrate. Because of this, there is only a small rise in the temperature of the substrate even when a large number of light emitting elements are mounted thereon and are turned on. It is, therefore, possible to maintain the light emission efficiency of the light emitting elements at a high level, and also improve the long-term reliability of the light emitting elements.

Because the light emitting element module of the present invention is formed by mounting light emitting elements on the enamel substrate for mounting light emitting elements of the present invention, there is only a small rise in the temperature of the substrate even when a large number of light emitting elements are mounted thereon and are turned on. It is, therefore, possible to maintain the light emission efficiency of the light emitting elements at a high level, and also improve the long-term reliability of the light emitting elements. The light emitting element module of the present invention may be favorably used, for example, for illumination apparatuses, display apparatuses, and traffic signals.

DESCRIPTION OF THE REFERENCE SYMBOLS

10 . . . Substrate for mounting light emitting elements, 11 . . . Light emitting element module, 12 . . . Core metal, 13 . . . Enamel layer, 14 . . . Electrode, 15 . . . Reflective cup portion, 16 . . . Light emitting element, 17 . . . Metal wire, 18 . . . Transparent resin, 19 . . . Heat dissipation through hole, 20 . . . Heat dissipation structure, 21 . . . Fins, 22 . . . Highly thermally conductive adhesive agent

BEST MODES FOR CARRYING OUT THE INVENTION

Embodiments of the present invention will now be described with reference made to the drawings. However, the present invention is not limited to the respective embodiments described below and, for example, component elements of these embodiments may be used together in suitable combinations.

Figure 1:
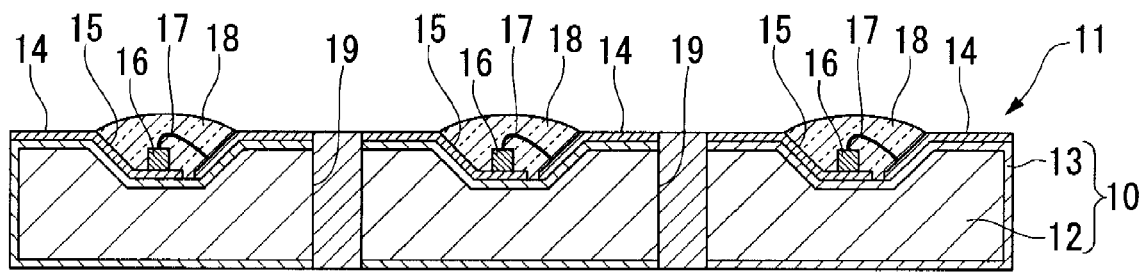
FIG. 1 is a cross-sectional view showing a first embodiment of the light emitting element module of the present invention.

FIG. 1 is a cross-sectional view showing a first embodiment of the present invention. A light emitting element module 11 of the present embodiment is formed by providing one or more heat dissipation through holes 19 in an enamel substrate that is formed by covering a surface of a core metal 12 with an enamel layer 13, and by mounting light emitting elements 16 on the resulting enamel substrate 10 for mounting light emitting elements in which reflective cup portions 15 for mounting light emitting elements have been provided. In the present embodiment, the core metal 12 is exposed at inner surfaces of the heat dissipation through holes 19.

The reflective cup portions 15 that are provided in the enamel substrate 10 for mounting light emitting elements are formed in a groove shape or in a bowl shape that is made up of a flat bottom surface and sloping surfaces. The angle of inclination of the sloping surfaces (i.e., the angle formed by the bottom surface and the sloping surfaces) is approximately from 10° to 90°, and is preferably from 40° to 90°. In the present embodiment, the heat dissipation through holes 19 are provided at intermediate positions between the plurality of reflective cup portions 19.

An electrode 14 that supplies power to drive the light emitting elements 16 as well as a control circuit and the like are formed on the light emitting element mounting surface of the enamel substrate 10 for mounting light emitting elements on which the reflective cup portions 15 are provided. When a resistive element that regulates the light emission intensity of a light emitting element 16 is included on this circuit pattern, it is desirable for the resistive element to be located in the vicinity of the heat dissipation through hole 19 in order for the heat generated from the resistive element to be efficiently dissipated.

In the present embodiment, the material that is used for the core metal 12 that makes up the enamel substrate 10 for mounting light emitting elements is not particularly limited provided that it is a metal on whose surface the enamel layer 13 can be strongly formed and, for example, a low carbon steel sheet or the like may be used. The enamel layer 13 is formed by baking glass powder onto a surface of the core metal 12. Moreover, it is desirable for the electrode 14 and the circuit pattern to be formed by employing a method in which a conductive paste such as a silver paste or copper paste is printed in a predetermined pattern using a printing method, for example, a screen printing method, and is then baked.

An LED is preferable for the light emitting elements 16 that are mounted on the enamel substrate 11 for mounting light emitting elements. When the light emitting element module 10 is used in an illumination apparatus, a white LED is preferable for the light emitting elements 16. As this white LED, it is desirable to use a white LED or the like that is obtained by combining, for example, a blue LED that is made from a gallium nitride (GaN) based semiconductor with one or two or more types of fluorescent substance that are excited by blue light and emit visible light other than blue light such as, for example, yellow light. Note that it is desirable that the fluorescent substance is used by being mixed or dispersed in transparent resin 18 that is used to seal the light emitting elements 16 mounted on the substrate.

In the light emitting element 11 of the present embodiment, the light emitting elements 16 are mounted on the bottom surface of the reflective cup portions 15. One electrode terminal of each light emitting element 16 is electrically connected to one electrode 14, while the other electrode terminal of each light emitting element 16 is electrically connected by a metal wire 17 (i.e., a bonding wire) to the adjacent other electrode 14. The transparent resin 18 which is an epoxy resin or a silicone resin or the like in which, if necessary, a fluorescent substance has been mixed is injected into the reflective cup portions 15 and cured so as to seal the reflective cup portions 15 with resin.

Next, a method of manufacturing the above described enamel substrate 10 for mounting light emitting elements as well as the light emitting element module 11 which employs this enamel substrate 10 will be described.

Firstly, in order to manufacture the core metal 12, the metal plate used for manufacturing the core metal is prepared. This metal plate is cut to the desired shape and then undergoes further machine working so that the respective desired numbers of reflective cup portions 15 where light emitting elements are to be mounted and heat dissipation through holes 19 are formed.

Next, the core metal 12 is immersed in a solution obtained by dispersing glass powder in a suitable solvent. Counter electrodes are then placed in the vicinity of this core metal 12, and voltage is then applied between the core metal 12 and the relevant counter electrode so that the glass powder is electrodeposited on the surface of the core metal 12. After this electrodeposition, the core metal 12 is removed from the solution and dried. It is then placed in a heating furnace and is heated to a predetermined temperature region. As a result, the glass powder is baked onto the surface of the core metal 12 thereby forming an enamel layer 13 and completing the manufacturing of an enamel substrate.

Next, the enamel layer adhering to the inner surfaces of the heat dissipation through holes 19 is removed using a method such as sand-blasting, so as to expose the core metal 12. Note that this method of removing the enamel layer from the inner surfaces of the heat dissipation through holes 19 may be replaced by a method in which electrodeposition is blocked in certain locations by covering the heat dissipation through holes 10 during the electrodeposition, or by a method in which the glass powder on the inner surfaces of the heat dissipation through holes 19 is removed prior to the baking of the enamel layer.

Next, using a method such as screen printing or the like, a conductive paste such as silver paste is printed to correspond to the formation pattern of the electrodes 14 and the circuit, and this is then baked so as to form the electrodes 14 and the required circuit. By performing each of the above described steps, an enamel substrate 10 for mounting light emitting elements is obtained.

Next, light emitting elements 16 are mounted by die bonding onto predetermined positions of the enamel substrate 10 for mounting light emitting elements that has been manufactured in the manner described above. Wire bonding is then performed so that the light emitting elements 16 are electrically connected to the electrodes 14 by metal wires 17. Thereafter, the interior of the reflective cup portions 15 is filled with a protective resin or with a resin in which a fluorescent substance has been mixed or dispersed. This resin is then cured thereby sealing the light emitting elements 16 with the transparent resin 18. As a result, the light emitting element module 11 shown in FIG. 1 is manufactured.

As a result of the enamel substrate 10 for mounting light emitting elements of the present embodiment being formed with a structure in which one or more heat dissipation through holes 19 are provided in an enamel substrate so that the core metal 12 is exposed at inner surfaces of the heat dissipation through holes 19, heat that is generated when the light emitting elements 16 are turned on is transmitted to the core metal 12 and is rapidly conducted throughout the entire core metal 12. In addition, as a result of heat being transmitted to the outside from the exposed surfaces of the core metal at the inner surfaces of the heat dissipation through holes 19, there is an improvement in the heat dissipation performance of the substrate, and there is only a small rise in the temperature of the substrate even when a large number of light emitting elements 16 are mounted thereon and are turned on. It is, therefore, possible to maintain the light emission efficiency of the light emitting elements 16 at a high level, and also improve the long-term reliability of the light emitting elements 16.

Because light emitting elements 16 are mounted on the enamel substrate 10 for mounting light emitting elements in the light emitting element module 11 of the present embodiment, there is only a small rise in the temperature of the substrate even when a large number of light emitting elements 16 are mounted thereon and are turned on. It is, therefore, possible to maintain the light emission efficiency of the light emitting elements 16 at a high level, and also improve the long-term reliability of the light emitting elements 16. Accordingly, the light emitting element module 11 of the present embodiment is favorably used, for example, for illumination apparatuses, display apparatuses, and traffic signals.

Moreover, by placing a resistor for regulating current in the vicinity of the heat dissipation through holes 19, it is also possible to suppress any rise in temperature that is caused by heat generated by the resistor.

Figure 2:
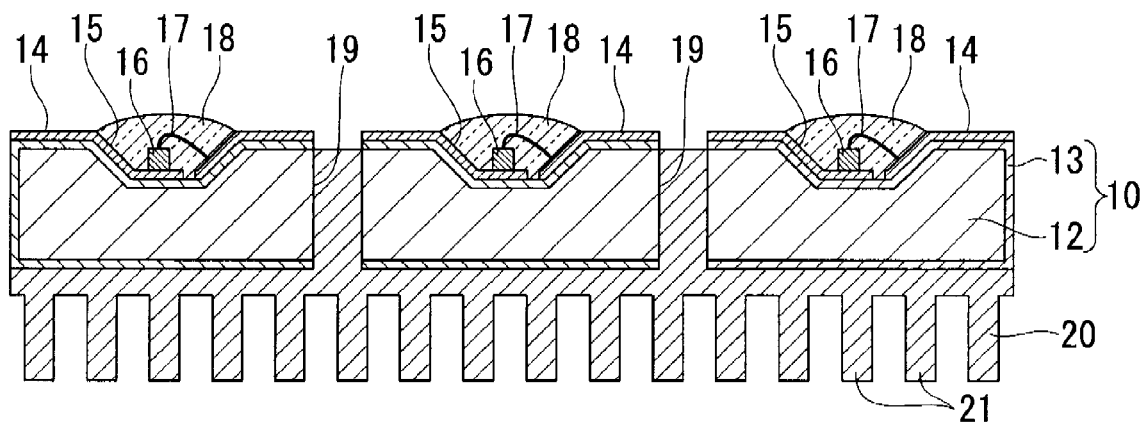
FIG. 2 is a cross-sectional view showing a second embodiment of the light emitting element module of the present invention.

FIG. 2 is a cross-sectional view showing a second embodiment of the present invention. The light emitting element module 11 of the present embodiment is provided with the same component elements as the light emitting element module of the above described first embodiment, and is furthermore characterized in that a heat dissipation structure 20 that has protruding portions is connected in a state in which the protruding portions are inserted into the heat dissipation through holes 19.

The example of this heat dissipation structure 20 that is shown is one that is formed from a metal having a high thermal conductivity such as, for example, aluminum, and that has the protruding portions provided on one side thereof, while having a number of fins 21 provided on the other side thereof, however, provided that it is able to improve the heat dissipation performance of a substrate which is in a state of being connected to the heat dissipation through holes 19, then the heat dissipation structure is not limited to this example.

Because the light emitting element module 11 of the present embodiment has a structure in which the heat dissipation structure 20 is connected thereto, heat is efficiently transmitted from the heat dissipation through holes 19 through the heat dissipation structure 20, so that it is possible to further improve the heat dissipation performance of the substrate.

Figure 3:
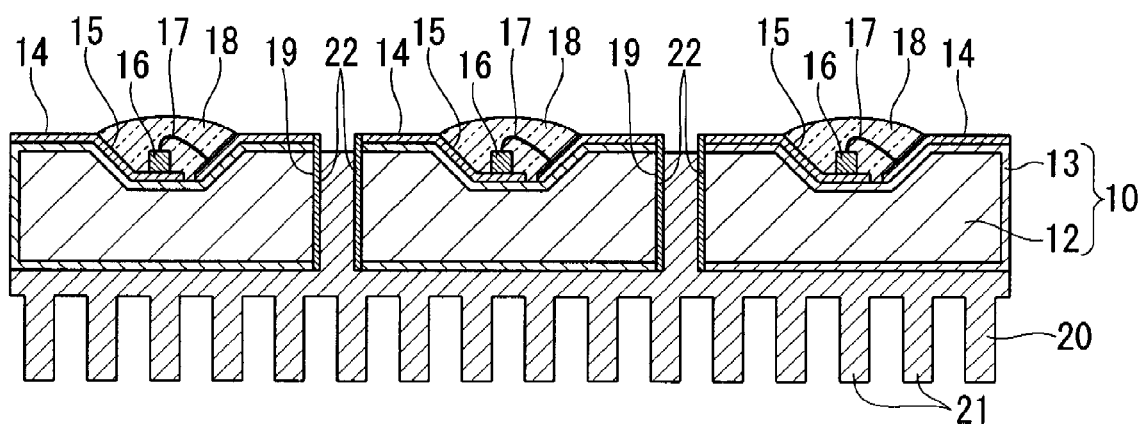
FIG. 3 is a cross-sectional view showing a third embodiment of the light emitting element module of the present invention.

FIG. 3 is a cross-sectional view showing a third embodiment of the present invention. The light emitting element module 11 of the present embodiment is provided with the same component elements as the light emitting element module of the above described second embodiment, and is furthermore characterized in that a highly thermoconductive adhesive agent 22 such as silicone grease or solder or the like is provided between the light emitting element module 11 and the protruding portions of the heat dissipation structure 20.

The light emitting element module 11 of the present embodiment makes it possible for heat to be even more efficiently transmitted from the heat dissipation through holes 19 through the heat dissipation structure 20, and makes it possible to further improve the heat dissipation performance of the substrate.

EXAMPLES

Substrate for Mounting Light Emitting Elements

Using a low carbon steel plate having a thickness of 1.5 mm, a length of 100 mm, and a width of 30 mm, reflective cup portions were formed by drilling. A total of fourteen reflective cup portions were formed in two rows with seven reflective cup portions spaced at 14 mm intervals in each row in the longitudinal direction of the steel plate. The dimensions of the reflective cup portions were as follows: a diameter of the bottom of the cup 2.0 mm, a depth of 0.5 mm, and a sloping portion at an angle of 45°.

A total of 18 heat dissipation through holes having a diameter of 3 mm were formed in three rows with six heat dissipation through holes spaced at 14 mm intervals in each row between the reflective cup portions.

Next, a liquid obtained by mixing glass powder in a dispersion medium was coated onto the surface of the metal plate (i.e., the core metal) in which the reflective cup portions and the heat dissipation through holes were formed, and this was then baked at 850° C. so as to form an enamel layer. The thickness of the enamel layer was adjusted so as to be 200 μm. Sand-blasting was then performed to remove the enamel layer from the inner surfaces of the heat dissipation through holes and thereby expose the core metal.

Next, copper paste was printed corresponding to an electrode pattern onto the surfaces where the reflective cup portions were formed. These were then baked so as to form electrodes having a thickness of 0.1 mm.

Example 1

As is shown in FIG. 1, blue LED elements having an output of 20 mW were mounted within the reflective cup portions of an enamel substrate having heat dissipation through holes. A total of 14 LED elements were mounted on the enamel substrate, and the electrodes and the LED were electrically connected by wire bonding using metal wires. Next, silicone resin in which a yellow light emitting fluorescent substance had been mixed was injected into the reflective cup portions. The resin was then cured so as to form a seal and thereby create white LED. In addition, resistive elements for regulating current were mounted close to the heat dissipation through holes.

60 mA of current was then supplied to the LED elements of the obtained module so as to generate light, and the temperature at the center of the substrate was measured. The temperature of the central portion was 140° C.

Example 2

In the same manner as in Example 1, blue LED elements having an output of 20 mW were mounted within the reflective cup portions of an enamel substrate having heat dissipation through holes. A total of 14 LED elements were mounted on the enamel substrate and, after wire bonding, silicone resin in which a yellow light emitting fluorescent substance had been mixed was injected into the reflective cup portions. The resin was then cured so as to form a seal and thereby create white LED. In addition, resisters for regulating current were mounted close to the heat dissipation through holes.

As is shown in FIG. 2, a total of 18 connecting protrusions having a height of 2 mm and a diameter of 3 mm were formed in three rows of six protrusions in each row spaced at 14 mm intervals as connecting portions for connecting to the heat dissipation through holes in a heat dissipation structure having aluminum fins 10 mm long. These connecting protrusions were inserted into the heat dissipation through holes so as to become connected to the enamel substrate.

In the same manner as in Example 1, 60 mA of current was then supplied to the LED elements so as to generate light, and the temperature at the center of the substrate was measured. The temperature of the central portion was 100° C.

Example 3

In the same manner as in Example 1, blue LED elements having an output of 20 mW were mounted within the reflective cup portions of an enamel substrate having heat dissipation through holes. A total of 14 LED elements were mounted on the enamel substrate and, after wire bonding, silicone resin in which a yellow light emitting fluorescent substance had been mixed was injected into the reflective cup portions. The resin was then cured so as to form a seal and thereby create white LED. In addition, resistors for regulating current were mounted close to the heat dissipation through holes.

As is shown in FIG. 3, a total of 18 connecting protrusions having a height of 2 mm and a diameter of 3 mm were formed in three rows of six protrusions in each row spaced at 14 mm intervals as connecting portions for connecting to the heat dissipation through holes in a heat dissipation structure having aluminum fins of 10 mm long. These connecting protrusions were inserted into the heat dissipation through holes so as to become connected to the enamel substrate. Silicone grease having a high level of thermal conductivity was then coated onto the connecting portions between the heat dissipation structure and the enamel substrate, and these two were then connected together.

In the same manner as in Example 1, 60 mA of current was then supplied to the LED elements so as to generate light, and the temperature at the center of the substrate was measured. The temperature of the central portion was 90° C. By using the highly thermoconductive silicone grease as an adhesive agent, the connection between the heat dissipation structure and the enamel substrate was easily achieved, and there was also an improvement in the heat dissipation performance due to the connection being made secure.

Comparative Example

Figure 4:
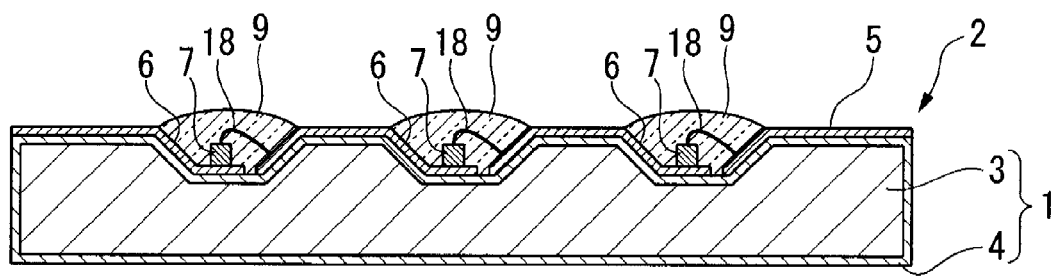
FIG. 4 is a cross-sectional view showing a light emitting element module that was manufactured as a comparative example.

Using an enamel substrate the same size as those used in Examples 1 to 3, but in which, as is shown in FIG. 4, no heat dissipation through holes were formed, blue LED elements having an output of 20 mW were mounted within the reflective cup portions thereof. In FIG. 4, the symbol 1 is an enamel substrate, 2 is a light emitting element module, 3 is a core metal, 4 is an enamel layer, 5 is an electrode, 6 is a reflective cup portion, 7 is a blue LED element, 8 is a metal wire, and 9 is transparent resin.

After a total of 14 LED elements have been mounted on this enamel substrate and wire-bonded, silicone resin in which a yellow light emitting fluorescent substance had been mixed was injected into the reflective cup portions. The resin was then cured so as to form a seal and thereby create white LED. In addition, resistors for regulating current were mounted therein. 60 mA of current was then supplied to the LED elements so as to generate light, and the temperature at the center of the substrate was measured. The temperature of the central portion was 150° C. The temperature was therefore higher than that of the enamel substrate of Example 1 in which through holes were provided.

INDUSTRIAL APPLICABILITY

The present invention can be applied to a substrate for mounting light emitting elements that is used for mounting a plurality of individual light emitting elements such as LED. In particular, the present invention can be applied to an enamel substrate for mounting light emitting elements that is able to ensure a satisfactory heat dissipation performance even when light emitting elements are mounted at a high density in applications, such as illumination apparatuses, and to a light emitting element module that is formed by mounting light emitting elements on this substrate, and to an illumination apparatus that has this light emitting element module, and to a display apparatus and a traffic signal.

The invention claimed is:

1. An enamel substrate for mounting light emitting elements comprising:
    a core metal;
    an enamel layer made of glass that is covering on a surface of the core metal;
    one or more through holes, and
    reflective cup portions that are provided on the enamel layer,
    wherein the core metal is exposed at inner surfaces of the through holes, and
    the one or more through holes are provided at intermediate positions between the reflective cup portions.

2. The enamel substrate for mounting light emitting elements according to claim 1, further comprising:
    a heat dissipation structure that has protruding portions, the protruding portions being inserted into the heat dissipation through holes.

3. The enamel substrate for mounting light emitting elements according to claim 2, wherein an adhesive agent having a high level of thermal conductivity is provided in a connecting portion between the enamel substrate for mounting light emitting elements and the heat dissipation structure.

4. A light emitting element module, comprising:
    light emitting elements mounted on the enamel substrate according to claim 1.

5. An illumination apparatus comprising the light emitting element module according to claim 4.

6. A display apparatus comprising the light emitting element module according to claim 4.

7. A traffic signal comprising the light emitting element module according to claim 4.

8. The enamel substrate for mounting light emitting elements according to claim 1, therein the enamel layer is covering two or more surfaces of the core metal.

9. The enamel substrate for mounting light emitting elements according to claim 1, further comprising a thermally-conductive adhesive disposed in the one or more through holes.

10. The enamel substrate for mounting light emitting elements according to claim 1, wherein the one or more through holes are disposed at first locations adjacent to second locations on which the light emitting elements are mounted.

* * * * *